US009651875B2

(12) United States Patent
Mulder et al.

(10) Patent No.: US 9,651,875 B2
(45) Date of Patent: *May 16, 2017

(54) ILLUMINATION SYSTEM AND LITHOGRAPHIC APPARATUS

(71) Applicants: ASML NETHERLANDS B.V., Veldhoven (NL); CARL ZEISS SMT GmbH, Oberkochen (DE)

(72) Inventors: Heine Melle Mulder, Veldhoven (NL); Steven George Hansen, Phoenix, AZ (US); Johannes Catharinus Hubertus Mulkens, Valkenswaard (NL); Markus Deguenther, Aalen (DE)

(73) Assignees: ASML NETHERLANDS B.V., Veldhoven (NL); CARL ZEISS SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/709,135

(22) Filed: May 11, 2015

(65) Prior Publication Data

US 2015/0241792 A1 Aug. 27, 2015

Related U.S. Application Data

(63) Continuation of application No. 13/051,384, filed on Mar. 18, 2011, now Pat. No. 9,116,439.

(Continued)

(51) Int. Cl.
*G03B 27/72* (2006.01)
*G03F 7/20* (2006.01)

(52) U.S. Cl.
CPC ...... *G03F 7/70566* (2013.01); *G03F 7/70091* (2013.01); *G03F 7/70116* (2013.01)

(58) Field of Classification Search
CPC .................. G03F 7/70116; G03F 7/70566
See application file for complete search history.

(56) References Cited

U.S. PATENT DOCUMENTS

| 8,040,492 B2 | 10/2011 | Fiolka |
| 2003/0038225 A1* | 2/2003 | Mulder ............... G03F 7/70116 250/205 |

(Continued)

FOREIGN PATENT DOCUMENTS

| CN | 101025573 A | 8/2007 |
| JP | 2002-116414 | 4/2002 |

(Continued)

OTHER PUBLICATIONS

Japanese Office Action mailed Jul. 13, 2012 in corresponding Japanese Patent Application No. 2011-056066.

(Continued)

*Primary Examiner* — Deoram Persaud
(74) *Attorney, Agent, or Firm* — Pillsbury Winthrop Shaw Pittman LLP

(57) ABSTRACT

An illumination system is disclosed having a polarization member that includes first and second polarization modifiers movable into at least partial intersection with a radiation beam such that the respective polarization modifier applies a modified polarization to at least part of the beam. The illumination system further includes an array of individually controllable reflective elements positioned to receive the radiation beam after it has passed the polarization member, and a controller configured to control movement of the first and second polarization modifiers such that the first and second polarization modifiers intersect with different portions of the radiation beam.

21 Claims, 4 Drawing Sheets

Related U.S. Application Data

(60) Provisional application No. 61/329,371, filed on Apr. 29, 2010, provisional application No. 61/316,114, filed on Mar. 22, 2010.

(56) References Cited

U.S. PATENT DOCUMENTS

| | | | |
|---|---|---|---|
| 2004/0108467 A1* | 6/2004 | Eurlings | G03F 7/70116 250/492.1 |
| 2005/0146704 A1 | 7/2005 | Gruner et al. | |
| 2005/0264885 A1 | 12/2005 | Albert | |
| 2007/0058151 A1 | 3/2007 | Eurlings et al. | |
| 2007/0146676 A1* | 6/2007 | Tanitsu | G02B 26/008 355/71 |
| 2007/0165202 A1 | 7/2007 | Koehler et al. | |
| 2007/0195305 A1 | 8/2007 | Mulder et al. | |
| 2007/0263192 A1 | 11/2007 | Bubke et al. | |
| 2008/0204692 A1* | 8/2008 | Gruner | G03F 7/70083 355/71 |
| 2008/0285000 A1* | 11/2008 | Ludovicus Van Dijck | G03F 7/70091 355/67 |
| 2009/0086185 A1* | 4/2009 | Mori | G03F 7/70566 355/71 |
| 2009/0135397 A1 | 5/2009 | Fiolka | |
| 2009/0174877 A1 | 7/2009 | Mulder et al. | |
| 2009/0279066 A1* | 11/2009 | Tinnemans | G03F 7/70108 355/71 |
| 2010/0149504 A1* | 6/2010 | Deguenther | G03F 7/70566 355/66 |
| 2012/0099093 A1* | 4/2012 | Patra | G03F 7/70141 355/71 |
| 2014/0168739 A1 | 6/2014 | Saenger | |

FOREIGN PATENT DOCUMENTS

| | | |
|---|---|---|
| JP | 2003-248118 | 9/2003 |
| JP | 2007-227918 | 9/2007 |
| JP | 2009-516367 | 4/2009 |
| JP | 2009-99623 A | 5/2009 |
| WO | 01/48520 | 7/2001 |

OTHER PUBLICATIONS

Chinese Office Action dated Nov. 19, 2012 in corresponding Chinese Patent Application No. 201110070331.9.

Singapore Invitation to Respond to Written Opinion dated Sep. 3, 2013 in corresponding Singapore Patent Application No. 201101760-5.

U.S. Notice of Allowance mailed May 14, 2015 in corresponding U.S. Appl. No. 13/051,384.

* cited by examiner

ILLUMINATION SYSTEM AND LITHOGRAPHIC APPARATUS

This application is a continuation of co-pending U.S. patent application Ser. No. 13/051,384, filed Mar. 18, 2011, which claims the benefit of priority under 35 U.S.C. §119(e) to U.S. Provisional Patent Application No. 61/316,114, filed on Mar. 22, 2010, and to U.S. Provisional Patent Application No. 61/329,371, filed on Apr. 29, 2010. The contents of those applications are incorporated herein in their entirety by reference.

FIELD

The present invention relates to an illumination system and to a lithographic apparatus.

BACKGROUND

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes an illumination system. The illumination system receives radiation from a source, for example a laser, and produces an illumination beam for illuminating a patterning device. Within a typical illumination system, the beam is shaped and controlled such that at a pupil plane the beam has a desired spatial intensity distribution, also referred to as an illumination mode. Examples of types of illumination modes are conventional, dipole, asymmetric, quadrupole, hexapole and annular illumination modes. This spatial intensity distribution at the pupil plane effectively acts as a secondary radiation source for producing the illumination beam. Following the pupil plane, the radiation is typically focused by an optical element (e.g., lens) group referred to hereafter as "coupling optics". The coupling optics couples the focused radiation into an integrator, such as a quartz rod. The function of the integrator is to improve the homogeneity of the spatial and/or angular intensity distribution of the illumination beam. The spatial intensity distribution at the pupil plane is converted to an angular intensity distribution at the object being illuminated by the coupling optics, because the pupil plane substantially coincides with the front focal plane of the coupling optics. Controlling the spatial intensity distribution at the pupil plane can be done to improve the processing latitudes when an image of the illuminated object is projected onto a substrate. In particular, spatial intensity distributions with dipolar, annular or quadrupole off-axis illumination modes have been proposed to enhance the resolution and/or other parameters of the projection, such as sensitivity to optical aberrations, exposure latitude and depth of focus.

Furthermore, the beam may be polarized. Using a correctly polarized beam may enhance image contrast and/or improve exposure latitude. These effects may result in an improved dimension uniformity of the imaged features. This eventually leads to an improved yield of the product

SUMMARY

There is especially a need for a polarized beam in a lithography apparatus with a high numerical aperture (NA) that images densely packed features having widths far below the wavelength of the used radiation beam.

A conventional lithographic apparatus has a possible drawback that polarized illumination modes wherein different areas of the pupil have different polarization directions cannot be created flexibly.

Accordingly, it would be advantageous, for example, to provide an illumination system, a lithography apparatus and a method arranged to provide polarized illumination modes with increased flexibility.

According to an aspect, there is provided an illumination system comprising a polarization member which comprises first and second polarization modifiers each connected to an actuator configured to move a respective polarization modifier into at least partial intersection with a radiation beam such that the polarization modifier applies a modified polarization to at least part of the radiation beam; an array of individually controllable reflective elements which is positioned to receive the radiation beam after it has passed the polarization member; and a controller configured to control the actuators such that the first and second polarization modifiers intersect with different portions of the radiation beam, part of the array of individually controllable reflective elements receiving part of the radiation beam which has had its polarization modified by the first and second polarization modifiers, and part of the array of individually controllable reflective elements receiving part of the radiation beam which has had its polarization modified by the first polarization modifier and not by the second polarization modifier.

According to a further aspect, there is provided a method of controlling the polarization of a radiation beam incident upon an array of individually controllable reflective elements, the method comprising moving a first polarization modifier such that it intersects with a portion of the radiation beam, and moving a second polarization modifier such that it intersects with a different portion of the radiation beam, such that a first part of the array of individually controllable reflective elements receives radiation which has had its polarization modified by the first and second polarization modifiers, and a second part of the array of individually controllable reflective elements receives radiation which has had its polarization modified by the first polarization modifier and not by the second polarization modifier.

According to a further aspect, there is provided an illumination system comprising a polarization member which comprises a polarization modifier connected to an actuator configured to move the polarization modifier such that it does not intersect with a radiation beam, such that it fully intersects with the radiation beam, or such that it partially intersects with the radiation beam an array of individually controllable reflective elements which is positioned to receive the radiation beam after it has passed the polarization member, and a polarization shaping element which is located in a pupil plane of the illumination system and is configured to shape the polarization of the radiation beam after it has been reflected by the array of individually controllable elements.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
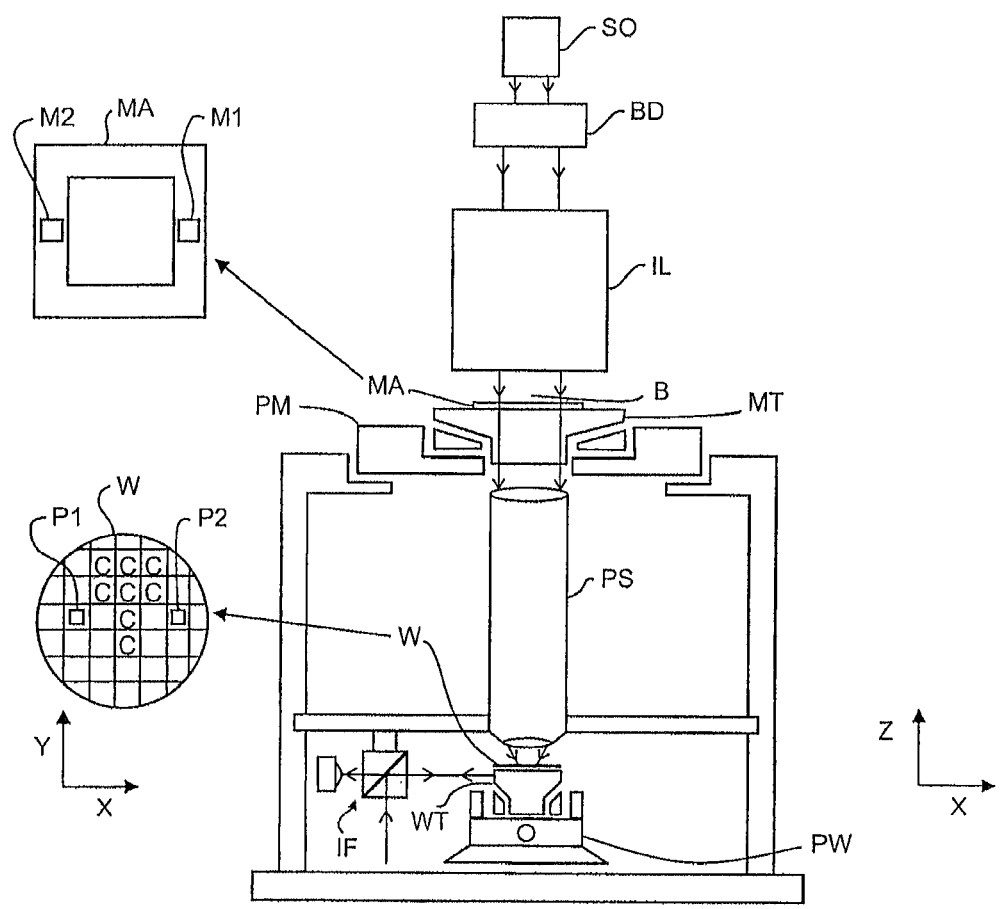
FIG. 1 shows a lithographic apparatus according to an embodiment of the invention.

FIG. 1 schematically shows a lithographic apparatus according to one embodiment of the invention. The apparatus comprises:

an illumination system (also known as an illuminator) IL configured to condition a radiation beam B (e.g. EUV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illumination system IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator and a condenser. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
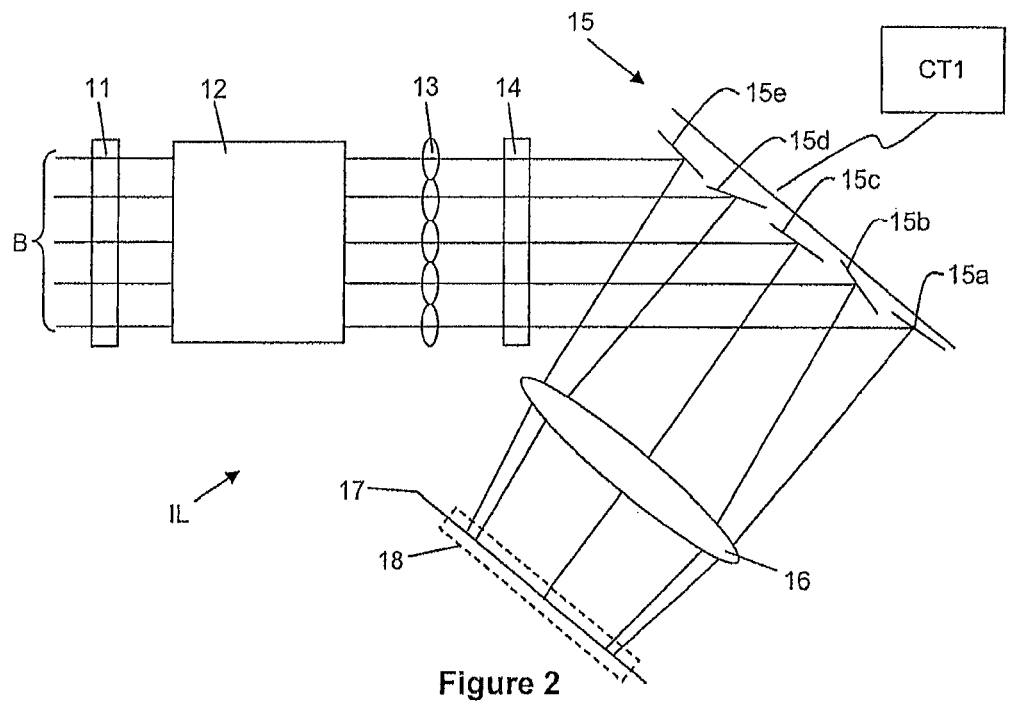
FIG. 2 shows an illumination system according to an embodiment of the invention.

FIG. 2 shows part of an embodiment of the illumination system IL. The illumination system IL conditions the radiation beam B, which is received from a source (not shown). The illumination system comprises a polarization rotation element 11, a beam homogenizer 12, a microlens array 13, a polarization member 14, an array of individually controllable reflective elements 15 and redirecting optics 16. The illumination system may further comprise a polarization shaping element 18, which is described further below. In operation, the radiation beam B may be generated in a linearly polarized form by the source. The radiation beam B passes through the polarization rotation element 11, which comprises a rotatable wave plate and which may be used to rotate the polarization axis of the radiation beam. The radiation beam B then passes through the homogenizer 12, which homogenizes the radiation beam. The radiation beam B then passes through the microlens array 13, which separates the radiation beam into a multiplicity of individually collimated radiation sub-beams, each of which is incident upon a different reflective element 15a-e of the array of individually controllable reflective elements 15. The polarization member 14, which is located between the microlens array 13 and the array of individually controllable reflective elements 15, modifies the polarization of the radiation beam B before it is incident upon the array of individually controllable reflective elements in a manner described further below.

FIG. 2 shows a first radiation sub-beam incident at a first reflective element 15a. Like the other reflective elements 15b-e of the array of individually controllable reflective elements 15, the reflective element 15a reflects the sub-beam to an intermediate plane 17 via optics 16 (the optics may, for example, comprise a focusing lens). The intermediate plane 17 may be, for example, a pupil plane of the illumination system which acts as a secondary radiation source (as described above). The other reflective elements 15b-e reflect the other sub-beams shown to other areas of the plane 17 via the optics 16. By adjusting the orientations of the reflective elements 15a-e and thus determining the areas of the plane 17 on which the sub-beams are incident, almost any spatial intensity distribution in the plane 17 can be produced. A controller CT1 may be used to control the orientations of the reflective elements 15a-e.

Although the array of individually controllable reflective elements 15 is shown in FIG. 2 as five reflective elements 15a-e, in practice a significantly larger number of reflective elements may be provided in the array. The array of individually controllable reflective elements 15 may, for example, comprise a two-dimensional array. The array of individually controllable reflective elements 15 may, for example, comprise 100 reflective elements, 1000 reflective elements, or more. The array of individually controllable reflective elements 15 may be rectangular.

The microlens array 13 may be configured such that a different microlens is associated with each reflective element of the array of individually controllable reflective elements 15. The microlens array 13 may, for example, comprise a two-dimensional array. The microlens array 13 may, for example, comprise 100 microlenses, 1000 microlenses, or more. The microlens array may be rectangular.

Figure 3:
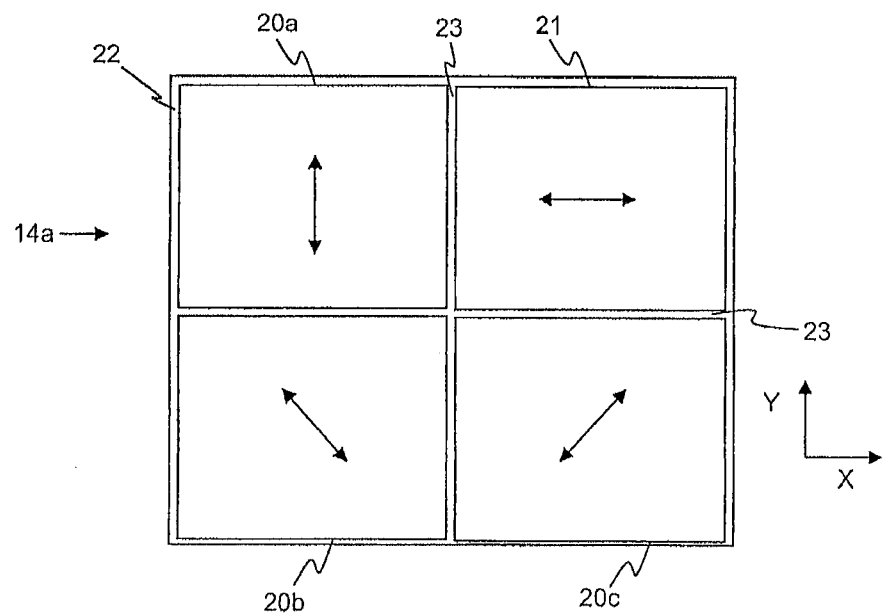
FIG. 3 shows a polarization member which may form part of the illumination system.

FIG. 3 shows schematically viewed from above an embodiment 14a of the polarization member 14. The polarization member comprises three wave plates 20a-c and a window 21. The wave plates 20a-c may be formed from crystalline quartz, and may be provided with a antireflection coating. Each of the wave plates 20a-c is configured to apply a different polarization to the radiation beam. In this embodiment, the radiation beam is linearly polarized in the x-direction when it is incident upon the polarization member 14. This polarization is represented schematically by a horizontal double-headed arrow in the window 21. The first wave plate 20a is configured to rotate the polarization of the radiation beam through 90°, such that the radiation beam is then polarized in the y-direction. This is represented schematically by the vertical double-headed arrow in the first wave plate 20a. The second wave plate 20b is configured to rotate the polarization of the radiation beam such that it lies in the plane x=−y. This is indicated schematically by the back-sloping double-headed arrow in the second wave plate 20b. The third wave plate 20c is configured to rotate the polarization of the radiation beam such that it lies in the plane x=y. This is shown schematically by the forward sloping double-headed arrow in the third wave plate 20c.

The wave plates 20a-c and the window 21 are held in a frame 22. The frame 22 may be configured such that gaps 23 are present between the wave plates 20a-c and between the wave plates and the window 21. The gaps 23 may allow the polarization member 14 to be more easily aligned relative to the radiation beam B.

In use, a pattern being projected from the patterning device MA onto the substrate W by the lithographic apparatus (see FIG. 1) may be optimally projected using radiation which is polarized in the x-direction. Where this is the case, the controller CT1 may control the orientations of the reflective elements 15a-e such that only reflective elements which have received radiation that passed through the window 21 are used to form the illumination mode used by the lithographic apparatus. Radiation incident upon the array of individually controllable reflective elements 15 which has passed through the wave plates 20a-c may, for example, be directed by the reflective elements 15a-e towards a beam dump, or towards another location which does not contribute to the illumination mode. Thus, an embodiment of the invention allows selection, via the controller CT1, of only x-polarized radiation in the illumination system of the lithographic apparatus.

If the pattern to be projected from the patterning device MA onto the substrate W would be better or best projected using radiation polarized in the y-direction, then the controller CT1 may control the reflective elements 15a-e such that only radiation which has passed through the first wave plate 20a is used to form the illumination mode. Similarly, if the pattern is such that radiation polarized in the plane x=−y would provide better or best imaging, then the controller CT1 may control the reflective elements 15a-e such that only radiation which has passed through the second wave plate 20b is used to form the illumination mode. Similarly, if the pattern is such that radiation polarized in the plane x=y would provide better or best imaging, then the controller CT1 may control the reflective elements 15a-e such that only radiation which has passed through the third wave plate 20c is used to form the illumination mode.

In some instances it may be desired to use a radiation beam which includes a combination of two or more of the four polarizations shown in FIG. 3. Where this is the case, components of the radiation beam B which have passed through different wave plates 20a-c (or the window 21) may be used to provide the desired polarizations. For example, radiation which has passed through the window 21 and radiation which has passed through the third wave plate 20c may be used to form an illumination mode which includes radiation polarized in the x-direction and radiation polarized in the x=y direction.

In some instances it may be desired to use radiation which approximates radiation that is not polarized. Where this is the case, a component of the radiation beam which has passed through the window 21 may be used, for example, together with a component of the radiation beam which has passed through the first wave plate 20a. Alternatively, a component of the radiation beam which has passed through the second wave plate 20b may be used together with a component of the radiation beam which has passed through the third wave plate 20c. In a further alternative, components of the radiation beam which have passed through all three wave plates 20a-c and through the window 21 may be used.

The window 21 may have the same optical path length as the wave plates 20a-c in order to provide consistency of optical path length travelled by the radiation beam in the illumination system. In an embodiment, the wave plates 20a-c may be sufficiently thin that they do not significantly affect the optical path length traveled by the radiation beam. Where this is the case, the window 21 may be omitted.

Figure 4A:
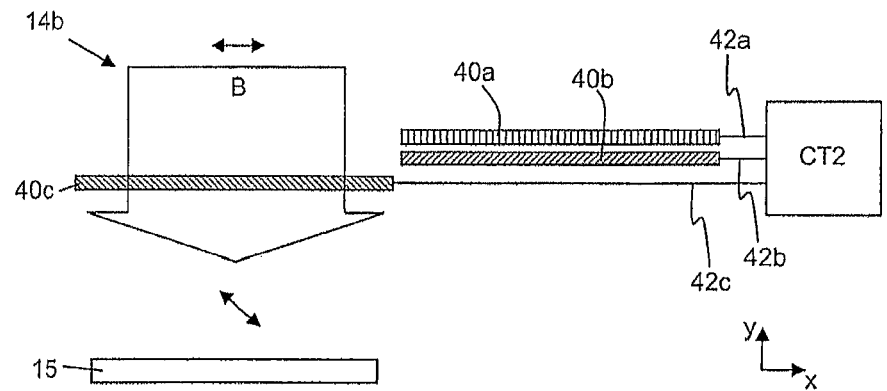
FIGS. 4A-C shows another polarization member which may form part of the illumination system.

FIG. 4 shows schematically a polarization member 14b according to a further embodiment of the invention. Referring to FIG. 4a, the polarization member comprises three wave plates 40a-c which are located adjacent to one another. The wave plates 40a-c may be formed from crystalline quartz, and may be provided with an antireflection coating. Each wave plate 40a-c is connected to an actuator 42a-c which is operated by a controller CT2. The controller CT2 may be used to move each of the actuators 42a-c independently, such that one or more of the wave plates 40a-c is in partial intersection with the radiation beam B, such that one or more of the wave plates 40a-c fully intersects the radiation beam, or such that none of the wave plates 40a-c intersects with the radiation beam. The wave plates 40a-c may be sufficiently thin that the path length of the radiation beam B does not change significantly when it passes through one or more of the wave plates (compared with the path length if the radiation beam passes through none of the wave plates). The wave plates 40a-c may be rectangular, or may have any other suitable shape. Distal edges of the wave plates 40a-c may be linear, and may be substantially parallel to rows of the reflective elements of the array 15.

Each of the wave plates 40a-c is configured to rotate the polarization of the radiation beam through substantially 45°. Thus, when the radiation beam B passes through one wave plate the polarization is rotated by substantially 45°, when the radiation beam B passes through two wave plates the polarization is rotated by substantially 90°, and when the radiation beam B passes through three wave plates the polarization is rotated by substantially 135°. In an embodiment, the wave plates 40a-c may be configured to rotate the polarization of the radiation beam by some other amount. Different wave plates 40a-c may be configured to rotate the polarization of the radiation beam by different amounts.

Referring to FIG. 4a, the actuators 42a-c may position the respective wave plates such that the radiation beam B does not pass through the first and second wave plates 40a,b but passes through the third wave plate 40c. This is indicated by double-headed arrows, which show the radiation beam as being polarized in the x-direction prior to passing through the wave plate 40c, and which show the radiation beam as being polarized in the x=−y plane after passing through the third wave plate 40c. The array of individually controllable reflective elements 15 is also shown in FIG. 4a. It can be seen that the array of individually controllable reflective elements 15 receives radiation which is polarized in the x=−y plane. An illumination mode formed by the array of individually controllable reflective elements 15 thus has an x=−y polarization.

Figure 4B:
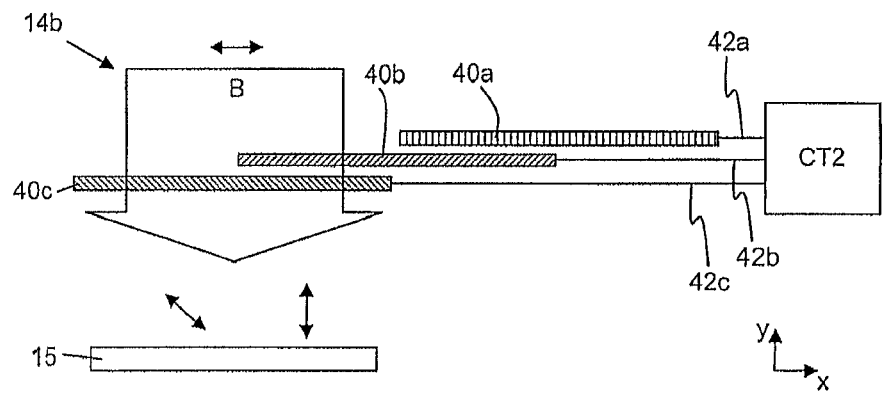

Referring to FIG. 4b, the actuators 42a-c may position the respective wave plates such that the radiation beam B passes through the third wave plate 40c, and in addition such that the second wave plate 40b intersects with half of the radiation beam B. As a result of the positions of the wave plates 40b,c, half of the radiation received by the array of individually controllable reflective elements 15 is polarized in the x=−y plane, and half of the radiation is polarized in the y-direction. An illumination mode formed by the array of individually controllable reflective elements 15 thus has a combination of x=−y polarization and y-polarization.

Figure 4C:
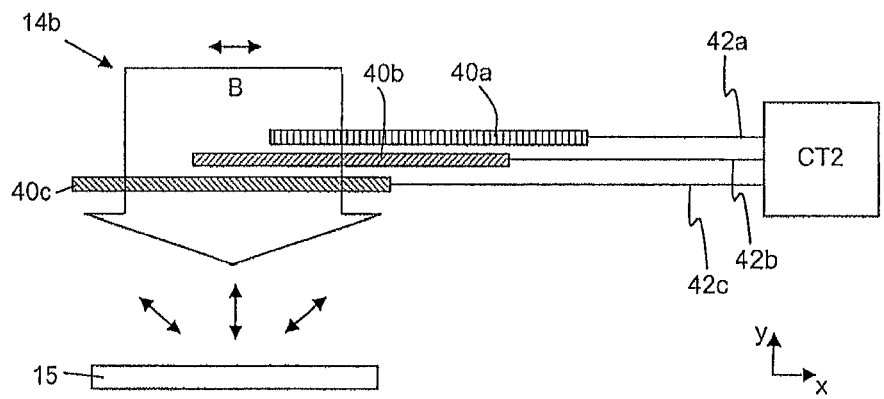

Referring to FIG. 4c, the actuators 42a-c may position the respective wave plates such that one third of the radiation received by the array of individually controllable reflective elements 15 receives radiation which has passed through the third wave plate 40c, one third of the array of individually controllable reflective elements receives radiation which is passed through the second and third wave plates 40b,c, and one third of the array of individually controllable reflective elements receives radiation which is passed through the first, second and third wave plates 40a-c. Thus, a third of the array of individually controllable reflective elements 15 receives radiation which is polarized in the x=−y direction, a third of the array of individually controllable reflective elements receives radiation which is polarized in the y-direction, and a third of the array of individually controllable reflective elements receives radiation which is polarized in the x=y direction. An illumination mode formed by the array of individually controllable reflective elements 15 thus has a combination of x=−y polarization, y-polarization and x=y polarization.

The wave plates 40a-c and actuators 40a-c of the polarization member 14b allow selection of the polarization of radiation which is incident upon different parts of the array of individually controllable reflective elements 15. The controller CT2 may be used to determine which parts of the array of individually controllable reflective elements 15 receive which polarization.

Although in the embodiments shown in FIGS. 4b and 4c the radiation beam B has been separated into equal portions each having a different polarization, the separation of the radiation beam may be into unequal portions. For example, the first actuator 42a may position the first wave plate 40a such that it applies a polarization rotation to any selected proportion of the radiation beam B. The first actuator 42a may be controlled by the controller CT2 such that the first wave plate 40a adopts positions which correspond to the locations of rows of reflective elements of the array of individually controllable reflective elements 15. For example, the first actuator 42a may position the first wave plate 40a such that it intersects a portion of the radiation beam B which is incident upon a first row of reflective elements of the array of individually controllable reflective elements 15 (the right hand row in this example, since the first wave plate is introduced from the right hand side). Similarly, the first actuator 42a may position the first wave plate 40a such that it intersects a portion of the radiation beam B which is incident upon the first and second rows of the array of individually controllable reflective elements 15, a portion of the radiation beam which is incident upon the first, second and third rows of the array of individually controllable reflective elements 15, or any other number of rows of the array of individually controllable reflective elements 15. The other wave plates 40b,c may be controlled in an equivalent manner.

In a modified embodiment (not illustrated), a window may be connected to each wave plate 40a-c, the windows being positioned such that the radiation beam B passes through the windows when it does not pass through the wave plates. This may be done, for example, to help ensure that the optical path length travelled by the radiation beam B remains the same irrespective of whether or not the radiation beam has passed through a wave plate. In the embodiment illustrated in FIG. 4, the windows are omitted because the thicknesses of the wave plates 40a-c are sufficiently small that the optical path length of the radiation is not significantly affected by passage through the wave plates. The wave plates 40a-c may, for example, have a thickness of 900 microns or less, desirably 300 microns or less.

Although the polarization member 14 is shown in FIG. 2 as being located between the microlens array 13 and the array of individually controllable reflective elements 15, it may be provided in any suitable location. The location of the polarization member 14 may be such that it allows control of the polarization of the radiation which is incident on different parts of the array of individually controllable reflective elements 15. In the case of the embodiment shown in FIG. 4 (or equivalent embodiments), the polarization member may be positioned such that it allows the polarization of radiation received by the array of individually controllable reflective elements 15 to be controlled on a row by row basis (the rows being rows of reflective elements). This may be achieved, for example, by providing the polarization member 14 adjacent to the array of individually controllable reflective elements 15. The polarization member 14 may be sufficiently far from the array of individually controllable reflective elements 15 that it does not block radiation which has been reflected by the array of individually controllable reflective elements, It may be possible to provide the polarization member 14 between the homogenizer 12 and the microlens array 13. It may be possible to provide part of the polarization member 14 between the homogenizer and the microlens array 13, and part of the polarization member between the microlens array and the array of individually controllable reflective elements 15.

Although the illustrated embodiment of FIG. 4 shows three wave plates, two wave plates, four wave plates, five wave plates or any suitable number of wave plates may be used.

The polarization of the radiation beam when incident upon the array of individually controllable reflective elements 15 may be controlled by a combination of the polarization member 14 and the polarization rotation element 11. The polarization rotation element 11 may, for example, comprise a wave plate which is rotatably mounted. The polarization rotation element 11 may, for example, be used to rotate the polarization of the radiation beam through 90°, 45°, 22.5° or any other rotation prior to the radiation beam being incident upon the polarization member 14. Thus, taking the configuration of the polarization member 14 shown in FIG. 4b as an example, the radiation beam B may be polarized in the y-direction by the polarization rotation element 11 (rather than the x-direction shown in FIG. 4b), and as a consequence of this the radiation incident upon the array of individually controllable reflective elements 15 would be polarized in the x=y direction and in the x-direction (rather than in the x=−y direction and the y-direction as shown in FIG. 4b).

In a further arrangement, the polarization rotation element 11 may, instead of or in addition to being a rotatable wave plate, comprise a set of wave plates which may be used to apply different polarization rotations to the radiation beam B by moving the wave plates into and out of intersection with the radiation. The wave plates may for example be held in an exchanger which, for example, comprises a rotatable disk, the wave plates being distributed around the disk. The exchanger may be rotated in order to bring a desired wave plate into intersection with the radiation beam B.

In an embodiment, it may be desired to provide an illumination mode in which a particular polarization of the radiation beam has an intensity which does not correspond to reflection of the radiation beam from an integer number of rows of the array of individually controllable reflective elements 15. For example, it may be desired to provide the polarization with an intensity which corresponds to reflection of the radiation beam from three and a half rows of the reflective array (e.g. reflection from 160 reflective elements). Where this is the case, the wave plates 40a-c may be positioned such that radiation having the desired polarization is incident upon four rows of the array of individually controllable reflective elements, and the mirrors of the array may be oriented such that a number of mirrors equivalent to half a row of the array do not direct radiation towards the illumination mode. Those mirrors may be oriented, for example, such that they direct radiation towards a beam stop or some other location.

In general, the wave plates 40a-c may be used to select the intensities of different polarizations of radiation with an accuracy which corresponds to the number of rows of reflective elements in the array of individually controllable reflective elements 15. The reflective elements of the array of individually controllable reflective elements 15 may be used to adjust the intensities of the relative polarizations of the radiation beam with a high accuracy (for example with an accuracy which corresponds or approximately corresponds to the number of reflective elements in the reflective array).

The controller CT1 which is used to control the orientations of the reflective elements 15a-e may be controlled in conjunction with the controller CT2 which controls the positions of the wave plates 40a-c. Both of these controllers may, for example, be controlled by software, or any other suitable arrangement. The software may also control the polarization rotation element 11, for example via a controller (not illustrated). The software may be configured to take into account the cumulative effects of the polarization rotation element 11, the polarization member 14 and the array of individually controllable reflective elements 15.

The direction of travel of the wave plates 40a-c when they are inserted into the radiation beam B may be substantially parallel to the scanning direction of the lithographic apparatus (taking into account any changes of beam direction within the lithographic apparatus). In other words, the direction of movement of the wave plates 40a-c when looking back along the radiation beam from the substrate table WT may be substantially parallel to the scanning direction. Where this is the case, a 'center of gravity' of polarized regions on the array of individually controllable reflective elements 15 is zero in a direction transverse to the scanning direction. In other words, substantially equal amounts of radiation with each polarization are present either side of a line which bisects, in the scanning direction, an exposure slit of the lithographic apparatus.

In an arrangement, the direction of travel of the wave plates 40a-c when they are inserted into the radiation beam B may be non-parallel to, for example transverse to, the scanning direction of the lithographic apparatus. Where this is the case, a 'center of gravity' of polarized regions on the array of individually controllable reflective elements 15 may be non-zero in a direction transverse to the scanning direction. This may apply an unwanted eccentricity to the radiation beam.

Although the embodiment shown in FIG. 4 introduces all of the wave plates 40a-c into intersection with the radiation beam from the same side of the radiation beam, it is not necessary that this is the case. For example, one or more wave plates may be introduced into the radiation beam from an opposite side of the radiation beam. Wave plates may be introduced into the radiation beam from any side of the radiation beam.

Although the wave plates 40a-c are shown in FIG. 4 as being adjacent to one another, in some instances, the wave plates may be spaced apart from one another.

In an embodiment of the invention, a single wave plate is provided which may have a position which is controlled in the same manner as shown in FIG. 4 (i.e. via an actuator and a controller). The single wave plate may be used to control the polarization of radiation incident at different parts of the array of individually controllable reflective elements 15. For example, the single wave plate may rotate polarization through 90°. This single wave plate may, for example, be positioned such that it intersects with half of the radiation beam B. Where this is done, half of the array of individually controllable reflective elements 15 will receive radiation polarized in a first direction (e.g. the x-direction), and the remaining half of the reflective array will receive radiation which is polarized in a transverse direction (e.g. the y-direction). The single wave plate may, for example, be positioned such that it intersects with any suitable portion of the radiation beam B.

This embodiment (or other embodiments) may be used in conjunction with the polarization rotation element 11, which may be used to modify the polarization of the radiation beam before it arrives at the polarization member 14.

Figure 5A:
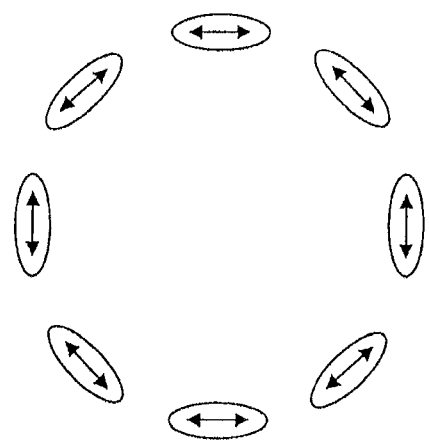
FIGS. 5A-B shows schematically illumination modes which may be formed using an embodiment of the invention.
Figure 5B:
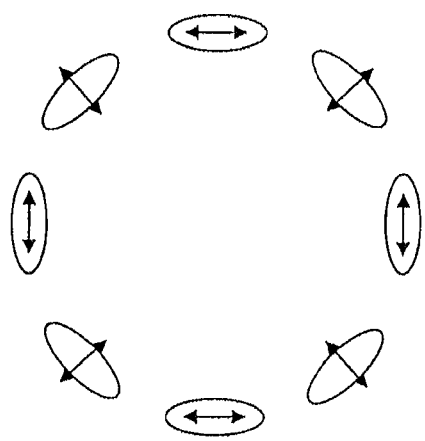

This embodiment (or other embodiments) may be used in conjunction with the polarization shaping element 18. The polarization shaping element may, for example, comprise a polarization modifier, such as one or more wave plates, located in a pupil plane of the illumination system and configured to shape the polarization of the radiation beam when forming an illumination mode. For example, the polarization shaping element may shape the polarization of a linearly polarized radiation beam such that an octupole illumination mode has polarization which lies transverse to the radial direction, as shown schematically in FIG. 5a. When the single wave plate is positioned such that it intersects with half of the radiation beam B, then the polarization shaping element will shape the polarization such that four poles of the octupole illumination mode have radial polarization, and four poles of the octupole illumination mode have polarization which lies transverse to the radial direction, as shown in FIG. 5b. Different polarization shaping elements may be used in conjunction with one or more of embodiments described herein.

The wave plates referred to above may be considered to be examples of polarization modifiers. Embodiments of the invention may use polarization modifiers other than wave plates.

Embodiments of the invention may be combined with the method and apparatus described in United States Patent Application Publication No. US 2009-174877, the contents of which are herein incorporated by reference in its entirety.

Furthermore, it is noted that it is possible to change the angle of polarization (possibly at the cost of one or more other parameters like IPS).

In an embodiment, there is provided an illumination system, comprising: a polarization member comprising first and second polarization modifiers each connected to an actuator configured to move a respective polarization modifier into at least partial intersection with a radiation beam such that the polarization modifier applies a modified polarization to at least part of the radiation beam; an array of individually controllable reflective elements positioned to receive the radiation beam after it has passed the polarization member; and a controller configured to control the actuators such that the first and second polarization modifiers intersect with different portions of the radiation beam, part of the array of individually controllable reflective elements receiving part of the radiation beam which has had its polarization modified by the first and second polarization modifiers, and part of the array of individually controllable reflective elements receiving part of the radiation beam which has had its polarization modified by the first polarization modifier and not by the second polarization modifier.

In an embodiment, the polarization member further comprises a third polarization modifier connected to an actuator configured to move the third polarization modifier into at least partial intersection with the radiation beam such that the third polarization modifier applies a modified polarization to part of the radiation beam, and the controller is further configured to control the actuator of the third polarization modifier such that the third polarization modifier intersects with a portion of the radiation beam, such that part of the array of individually controllable reflective elements receives part of the radiation beam which has had its polarization modified by the first, second and third polarization modifiers. In an embodiment, the polarization member further comprises an additional polarization modifier connected to an actuator configured to move the additional polarization modifier into at least partial intersection with the radiation beam such that the additional polarization modifier modifies the polarization of at least part of the radiation beam. In an embodiment, the polarization modifiers are located adjacent to one another. In an embodiment, the controller is configured to control each actuator such that it moves each polarization modifier to a plurality of positions which intersect with different portions of the radiation beam. In an embodiment, each of the plurality of positions corresponds with a different row of the array of individually controllable reflective elements. In an embodiment, each polarization modifier comprises a wave plate. In an embodiment, each wave plate is configured to rotate the polarization of the radiation beam through substantially 45 degrees. In an embodiment, each polarization modifier has a thickness of 300 microns or less. In an embodiment, the illumination system further comprises a polarization rotation element configured to modify the polarization of the radiation beam before the radiation beam is incident upon the polarization member. In an embodiment, the polarization member is located between a homogenizer and a microlens array, or between the microlens array and the array of individually controllable reflective elements. In an embodiment, the illumination system further comprises a polarization shaping element located in a pupil plane of the illumination system.

In an embodiment, there is provide an illumination system, comprising: a polarization member comprising a polarization modifier connected to an actuator configured to move the polarization modifier such that it does not intersect with a radiation beam, such that it fully intersects with the radiation beam, or such that it partially intersects with the radiation beam; an array of individually controllable reflective elements positioned to receive the radiation beam after it has passed the polarization member; and a polarization shaping element located in a pupil plane of the illumination system and configured to shape the polarization of the radiation beam after it has been reflected by the array of individually controllable elements.

In an embodiment, the illumination system is part of a lithographic apparatus and further comprises: a support structure configured to support a patterning device, the patterning device configured to pattern the radiation beam delivered from the illumination system according to a desired pattern; a substrate table configured to hold a substrate; and a projection system configured to project the patterned beam onto a target portion of the substrate. In an embodiment, each actuator is configured to move each polarization modifier in a direction which is substantially parallel to a scanning direction of the lithographic apparatus.

In an embodiment, there is provided a method of controlling the polarization of a radiation beam incident upon an array of individually controllable reflective elements, the method comprising: moving a first polarization modifier such that it intersects with a portion of the radiation beam; and moving a second polarization modifier such that it intersects with a different portion of the radiation beam, such that a first part of the array of individually controllable reflective elements receives radiation which has had its polarization modified by the first and second polarization modifiers, and a second part of the array of individually controllable reflective elements receives radiation which has had its polarization modified by the first polarization modifier and not by the second polarization modifier.

In an embodiment, the method further comprises moving a third polarization modifier such that it intersects with a different portion of the radiation beam and modifies the polarization of the different portion of the radiation beam, a third part of the array of individually controllable elements receiving radiation which has had its polarization modified by the third polarization modifier. In an embodiment, each polarization modifier comprises a wave plate configured to rotate the polarization of the radiation beam through substantially 45 degrees. In an embodiment, the first polarization modifier intersects all of the radiation beam, and thereby modifies the polarization of the whole radiation beam.

In an embodiment, there is provided an illumination system, comprising: a polarization member comprising first and second polarization modifiers lying in substantially the same plane and configured to apply different polarizations to the beam of radiation; and an array of individually controllable reflective elements positioned to receive the radiation beam after it has passed the polarization member, part of the array of individually controllable reflective elements receiving the part of the radiation beam which has had its polarization modified by the first polarization modifier, and part of the array of individually controllable reflective elements receiving part of the radiation beam which has had its polarization modified by the second polarization modifier.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 167 or 126 nm), and EUV radiation (e.g. having a wavelength of between 5 and 20 nm, e.g. having a wavelength of around 13.5 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An illumination system, comprising:
    a polarization member comprising a polarization modifier connected to an actuator system configured to move the polarization modifier such that it does not intersect with a radiation beam, such that it fully intersects with the radiation beam, or such that it partially intersects with the radiation beam;
    an array of individually controllable reflective elements positioned to receive the at least partly polarized radiation beam after it has passed the polarization member;
    a focusing lens configured to receive the radiation beam from the array of individually controllable reflective elements and to output a converging radiation beam; and
    a polarization shaping element located in a pupil plane of the illumination system and configured to shape the polarization of the radiation beam from the focusing lens by changing polarization of at least part of the radiation beam such that the radiation beam from the polarization shaping element has a part of the radiation beam with a different polarization than another part of the radiation beam.

2. The illumination system of claim 1, wherein the polarization shaping aspect of the polarization shaping element partially intersects with the radiation beam after it has been reflected by the array of individually controllable elements.

3. The illumination system of claim 1, wherein the polarization modifier comprises a first polarization element and a second polarization element and the actuator system is configured to cause relative movement between the first and second polarization elements.

4. The illumination system of claim 3, wherein the actuator system is configured to move the first polarization element and/or the second polarization element into at least partial intersection with the radiation beam, wherein the first and second polarization elements are at respectively different locations along the path of the radiation beam such that the first and second polarization elements respectively apply a modified polarization to at least part of the radiation beam.

5. The illumination system of claim 3, further comprising a control system configured to control the actuator system such that the polarizing aspect of the first and second polarization elements intersect with different portions of the radiation beam, part of the array of individually controllable reflective elements receiving part of the radiation beam which has had its polarization modified by the first polarization element and then subsequently by the second polarization element, and part of the array of individually controllable reflective elements receiving part of the radiation beam which has had its polarization modified by the first polarization element and not by the second polarization element.

6. The illumination system of claim 3, wherein each of the first and second polarization elements comprises a wave plate.

7. The illumination system of claim 3, wherein the polarization member further comprises a third polarization element connected to an actuator configured to move the third polarization element into at least partial intersection with the radiation beam such that the third polarization element modifies the polarization of at least part of the radiation beam.

8. The illumination system of claim 1, being part of a lithographic apparatus and further comprising:
    a support structure configured to support a patterning device, the patterning device configured to pattern the radiation beam delivered from the illumination system according to a desired pattern;
    a substrate table configured to hold a substrate; and
    a projection system configured to project the patterned beam onto a target portion of the substrate.

9. A method comprising:
    moving a polarization modifier using an actuator such that the polarization modifier at least partially intersects with a radiation beam in an illumination system;
    reflecting the at least partly polarized radiation beam after it has passed the polarization modifier using an array of individually controllable reflective elements;
    receiving the radiation beam from the array of individually controllable reflective elements at a focusing lens;
    outputting, from the focusing lens, a converging radiation beam; and
    shaping polarization of the radiation beam from the focusing lens using a polarization shaping element located in a pupil plane of the illumination system by changing polarization of at least part of the radiation beam such that the radiation beam from the polarization shaping element has a part of the radiation beam with a different polarization than another part of the radiation beam.

10. The method of claim 9, further comprising the polarization shaping aspect of the polarization shaping element partially intersecting with the radiation beam after it has been reflected by the array of individually controllable elements.

11. The method of claim 9, wherein moving the polarization modifier further comprises causing relative movement between a first polarization element of the polarization modifier and a second polarization element of the polarization modifier.

12. The method of claim 11, wherein the moving the polarization modifier further comprises moving the first polarization element and/or the second polarization element into at least partial intersection with the radiation beam, wherein the first and second polarization elements are at respectively different locations along the path of the radiation beam such that the first and second polarization elements respectively apply a modified polarization to at least part of the radiation beam.

13. The method of claim 11, further comprising controlling the movement of the polarization modifier such that the first and second polarization elements intersect with different portions of the radiation beam, part of the array of individually controllable reflective elements receiving part of the radiation beam which has had its polarization modified by the first polarization element and then subsequently by the second polarization element, and part of the array of individually controllable reflective elements receiving part of the radiation beam which has had its polarization modified by the first polarization element and not by the second polarization element.

14. The method of claim 11, wherein each of the first and second polarization elements comprises a wave plate.

15. The method of claim 9, further comprising patterning the radiation beam delivered from the polarization shaping element according to a desired pattern and projecting the patterned beam onto a target portion of a radiation-sensitive substrate.

16. An illumination system, comprising:
a polarization member comprising:
- a first polarization modifier connected to an actuator system configured to move the first polarization modifier into at least partial intersection with a radiation beam path at a first position in the radiation beam path,
- a second polarization modifier connected to the actuator system configured to move the second polarization modifier into at least partial intersection with the radiation beam path at a second position in the radiation beam path, the second position spaced from the first position downstream along the radiation beam path, and
- a third polarization modifier connected to the actuator system configured to move the third polarization modifier into at least partial intersection with the radiation beam path at a third position in the radiation beam path, the third position spaced apart from the first and second positions downstream along the radiation beam path such that a same portion of radiation first passes the first position then subsequently passes the second position and then subsequently passes the third position;

an array of individually controllable reflective elements positioned to receive at least partly polarized radiation beam after it has passed the polarization member; and a control system configured to control the actuator system to provide a polarizing aspect of at least one of the first to third polarization modifiers in only partial intersection with the radiation beam.

17. The illumination system of claim 16, wherein the control system is further configured to control the actuator system such that a polarizing aspect of at least two of the first to third polarization modifiers intersect with different portions of the radiation beam, part of the array of individually controllable reflective elements receiving part of the radiation beam which has had its polarization modified by a first of the at least two polarization modifiers and then subsequently by a second of the at least two polarization modifiers.

18. The illumination system of claim 16, wherein the control system is further configured to control the actuator system such that a polarizing aspect each of the first to third polarization modifiers intersects at a same time with at least a portion of the radiation beam.

19. The illumination system of claim 16, wherein at least two of the first to third polarization modifiers comprises a wave plate.

20. The illumination system of claim 16, further comprising a polarization shaping element located in a pupil plane of the illumination system and configured to shape the polarization of the radiation beam, after it has been reflected by the array of individually controllable elements, by changing polarization of at least part of the radiation beam such that the radiation beam from the polarization shaping element has a part of the radiation beam with a different polarization than another part of the radiation beam.

21. The illumination system of claim 16, being part of a lithographic apparatus and further comprising:
- a support structure configured to support a patterning device, the patterning device configured to pattern the radiation beam delivered from the illumination system according to a desired pattern;
- a substrate table configured to hold a substrate; and
- a projection system configured to project the patterned beam onto a target portion of the substrate.

* * * * *